United States Patent

Wojnarowski et al.

[11] Patent Number: 5,866,952
[45] Date of Patent: Feb. 2, 1999

[54] HIGH DENSITY INTERCONNECTED CIRCUIT MODULE WITH A COMPLIANT LAYER AS PART OF A STRESS-REDUCING MOLDED SUBSTRATE

[75] Inventors: Robert John Wojnarowski, Ballston Lake; Thomas Bent Gorczyca, Schenectady; Stanton Earl Weaver, Jr., Northville, all of N.Y.

[73] Assignee: Lockheed Martin Corporation, Bethesda, Md.

[21] Appl. No.: 565,269

[22] Filed: Nov. 30, 1995

[51] Int. Cl.⁶ .................................................. H01L 23/29
[52] U.S. Cl. ........................ 257/788; 257/724; 257/687; 257/701
[58] Field of Search ................................. 257/788, 787, 257/723, 687, 701, 724

[56] References Cited

U.S. PATENT DOCUMENTS

| | | | |
|---|---|---|---|
| 4,635,356 | 1/1987 | Ochuchi et al. | 257/724 |
| 4,783,695 | 11/1988 | Eichelberger et al. | 357/65 |
| 4,897,153 | 1/1990 | Cole et al. | 156/643 |
| 5,073,814 | 12/1991 | Cole, Jr. et al. | 357/54 |
| 5,108,825 | 4/1992 | Wojnarowski et al. | 428/209 |
| 5,157,589 | 10/1992 | Cole, jr. et al. | 361/414 |
| 5,161,093 | 11/1992 | Gorczyca et al. | 361/414 |
| 5,270,371 | 12/1993 | Cole et al. | 524/359 |
| 5,300,812 | 4/1994 | Lupinski et al. | 257/723 |
| 5,353,498 | 10/1994 | Fillion et al. | 29/840 |

FOREIGN PATENT DOCUMENTS

| | | | |
|---|---|---|---|
| 2572849 | 5/1986 | France | 257/723 |
| 4-73955 | 3/1992 | Japan | 257/723 |

Primary Examiner—Olik Chaudhuri
Assistant Examiner—Nathan K. Kelley
Attorney, Agent, or Firm—Geoffrey H. Krauss

[57] ABSTRACT

A high density interconnected multi-chip module is provided with a stress-reducing compliant material disposed around the chips prior to molding a polymeric substrate around the chips. Chips having contact pads are placed face down on a layer of adhesive supported by a base. A compliant material is deposited around the chips, and then a mold form is positioned around the chips. Polymeric substrate molding material is added within the mold form, and then the substrate molding material is hardened. A dielectric layer having vias aligned with predetermined ones of the contact pads and having an electrical conductor extending through the vias is situated on the hardened substrate molding material and faces of the chips. A thermal plug may be affixed to the backside of a chip prior to the addition of substrate molding material.

11 Claims, 5 Drawing Sheets

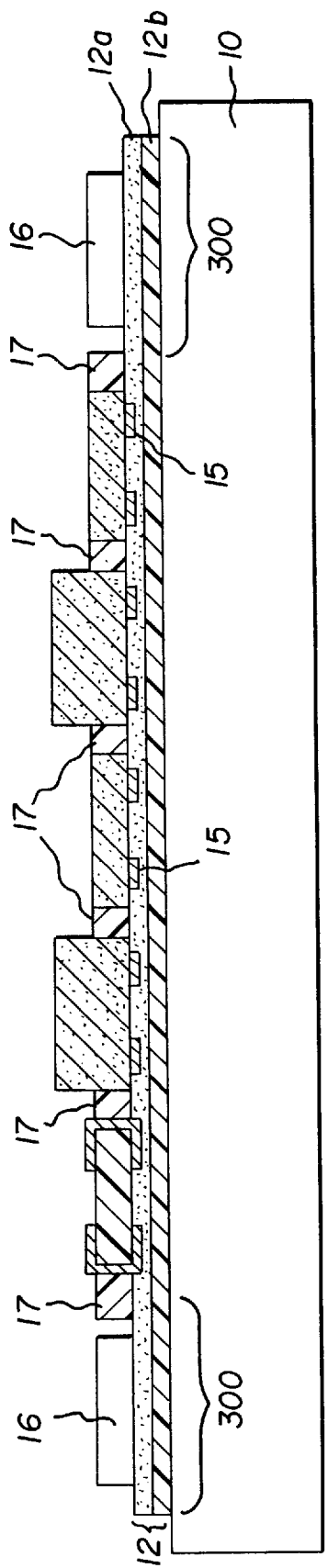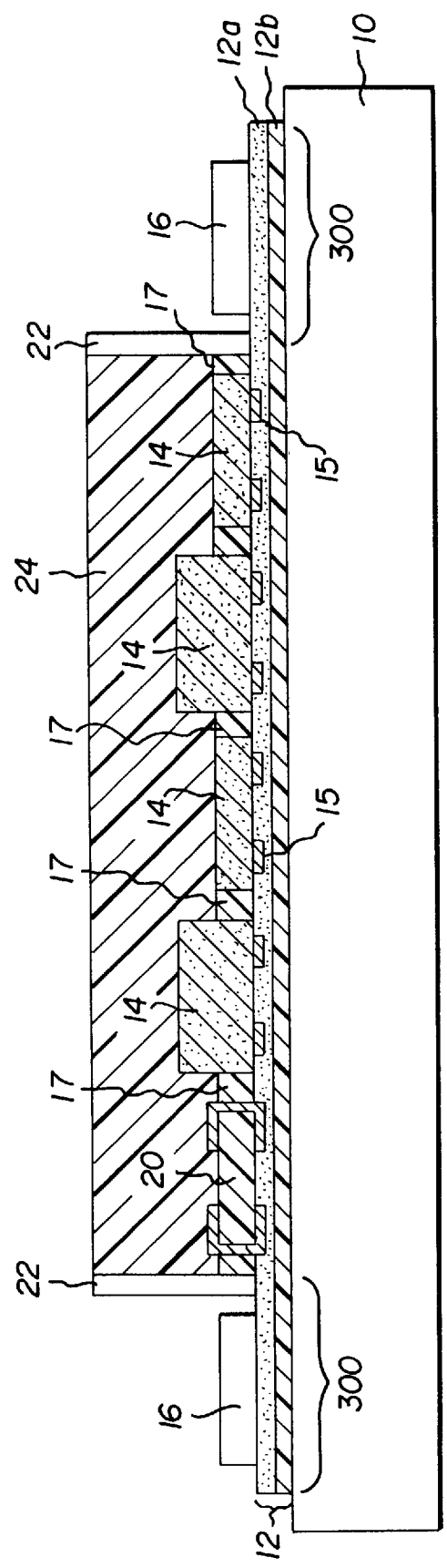

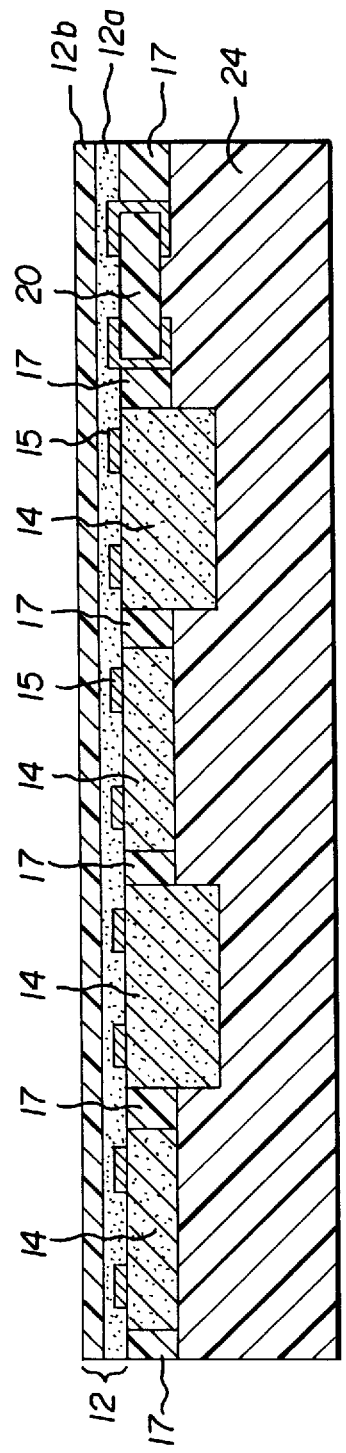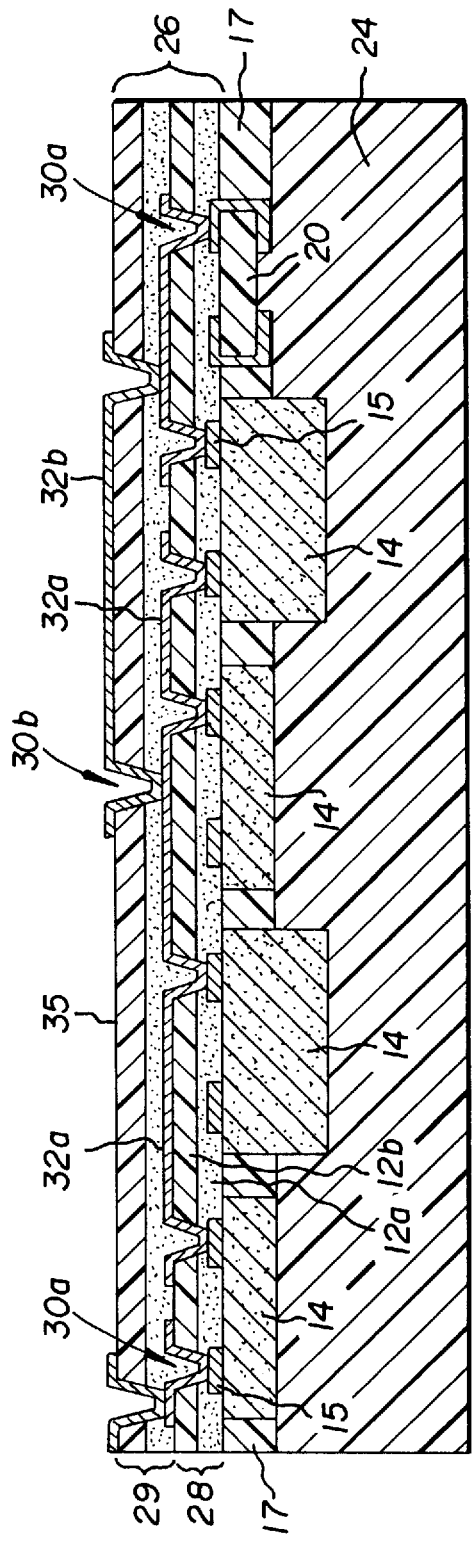

HIGH DENSITY INTERCONNECTED CIRCUIT MODULE WITH A COMPLIANT LAYER AS PART OF A STRESS-REDUCING MOLDED SUBSTRATE

The present invention relates to an improved polymer encapsulated multi-chip module and, more particularly, to the use of a compliant material around the integrated circuit chips to reduce the stresses within an operating module.

BACKGROUND OF THE INVENTION

A high density interconnect (HDI) structure offers many advantages in the compact assembly of electronic systems. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 25–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as "ULTEM®" 6000 resin, available from the General Electric Company, Fairfield, Conn.), or an adhesive composition described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film (which may be "KAPTON®" polyimide, available from E. I. du Pont de Nemours Company, Wilmington, Del.), of a thickness of approximately 0.0005–0.003 inches (approx. 12.5–75 microns), is pre-treated by reactive ion etching (RIE) to promote adhesion. The substrate and chips must then be coated with "ULTEM®" 1000 polyetherimide resin or another thermoplastic adhesive to adhere the "KAPTON®" resin film when it is laminated across the top of the chips, any other components and the substrate. Thereafter, via holes are provided (preferably by laser drilling) through the "KAPTON®" resin film, and "ULTEM®" resin layers, at locations in alignment with the contact pads on the electronic components to which it is desired to make contact. A metallization multi-layer, with a first layer comprising titanium and a second layer comprising copper, is deposited over the "KAPTON®" resin layer and extends into the via holes to make electrical contact to the contact pads disposed thereunder. This metallization layer may be patterned to form individual conductors during the deposition process or may be deposited as a continuous layer and then patterned using photoresist and etching. The photoresist is preferably exposed using a laser to provide an accurately aligned conductor pattern at the end of the process. Alternatively, exposure through a mask may be used.

Any additional dielectric layers for isolation between the first metallization layer and any subsequent metallization layers may be added by spinning on or spraying on a solvent solution of a desired dielectric adhesive material onto a thermosetting dielectric layer. Presently a siloxane polyimide/epoxy (SPIE) blend adhesive is used as an adhesive to bond additional layers of "KAPTON®". Since dielectric materials are used both in adhesive and in dielectric layers, there are special requirements placed on the system. In particular, in order for the final structure to be suitable over a wide temperature range, the dielectric layers (including the adhesives) must have high melting points and high thermal stability. Any candidate layer must provide good adhesion to the underlying dielectric and metallization and to overlying dielectric layer, and should also be inherently laser ablatable or should be rendered laser ablatable in accordance with U.S. Pat. No. 5,169,678 entitled, "Laser Ablatable Polymer dielectrics and Methods." Any misposition of the individual electronic components and their contact pads is compensated for by an adaptive laser lithography system which is the subject of some of the patents and applications listed hereinafter.

The process of designing an interconnection pattern for interconnecting all of the chips and components of an electronic system on a single high density interconnect substrate normally takes somewhere between one day and five weeks. Once an interconnect structure has been defined, assembly of the system on the substrate and the overlay structure is built-up on top of the chips and substrate, one layer at a time. Typically, the entire process can be finished in less than one day, as described in U.S. Pat. No. 5,214,655, entitled "Integrated Circuit Packaging Configuration for Rapid Customized Design and Unique test Capability" by C. W. Eichelberger, et al., herein incorporated in its entirety by reference. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Haller, et al.; U.S. Pat. No. 5,108,825, entitled "An Epoxy/Polyimide Copolymer Blend Dielectric and Layered Circuits Incorporating It" by C. W. Eichelberger, et al.; and U.S. patent application Ser. No. 08/239,785, "High Density Interconnect Structures Incorporating An Improved Dielectric Material and Method of Fabrication", by H. S. Cole, et al. Each of these Patents and Patent Applications, including the references contained therein, is hereby incorporated herein in its entirety by reference.

As stated above, conventional high density interconnect (HDI) processes often use cavities formed into a substrate base for the placement of chips so that the top surfaces of the chips are essentially planar with the surface of the substrate. The substrate is generally a ceramic or a composite structure. The conventional HDI technique for fabricating cavities in the substrate is to mechanically machine or mill out the cavity material with a computer-controlled diamond tooled bit. This time consuming process does not always provide the desired chip cavity depth and can result in cracks which render the substrate unusable.

Chips are placed into these milled out cavities on multiple drops of die attach adhesive for mechanical, thermal, and electrical mounting. Chips placed with this process can be displaced during further processing because there are non-uniform surface tension forces at the chip-to-die attach adhesive interface. This displacement reduces precision in chip location, requiring further processing steps to adapt each electrical interconnection to the chip misalignment. Also, the presence of moats surrounding the chips in conventional substrates may cause thinning of the adhesive of the polymer film at the chip perimeters and sagging of the polymer film over the moats, thus adding difficulty in placing vias and patterning interconnects close to the chip wells. Additionally, mismatches between the coefficients of thermal expansion of ceramic substrates and polymer overlays sometimes induce stress at the adhesive layer, thus tending to promote separation of the polymer film from the substrate.

U.S. Pat. No. 5,353,498, entitled "Method for Fabricating an Integrated Circuit Module", to Fillion et al. discloses a method of fabricating an HDI substrate by molding plastic around chips placed on a film, thus eliminating the milling process and providing a planar surface without moats between chips and the substrate. Briefly, the technique includes applying an insulative base sheet over a base. At least one chip having contact pads is placed face down on the base sheet. A mold form is positioned around a desired perimeter and surrounds at least one chip. Substrate molding material is added and then hardened within the mold form. Then the mold form and base are removed, the substrate is inverted, and the chips are interconnected. When the molding material surrounds, and is in direct contact with the chips, stresses build up due to the difference in the coefficients of thermal expansion of the silicon of the chips and the polymer matrix of the molding material.

To reduce this stress, one embodiment of U.S. Pat. No. 5,353,498 places a thin sheet of polymer over the backside of the chips prior to the addition of the substrate molding material. This leaves air-moats between the chips and reduces somewhat the stress buildup; however, as stated above, the presence of these moats may cause thinning of the adhesive of the polymer film at the chip perimeters and sagging of the polymer film over the moats. Also, thermal plugs, useful for removing heat from modules, cannot be encapsulated by this thin polymer sheet due to the extreme difference in thickness between a chip with, and without, a thermal plug.

Consequently, it would be desirable to have a plastic molding process in which the mold form becomes an integral part of the substrate that protects the substrate from exposure to chemicals and, additionally provides a mechanism to reduce stresses built up within the module.

OBJECTS OF THE INVENTION

Accordingly, a primary object of the present invention is to provide a high density interconnected module with a novel complaint layer as part of a stress-reducing, low warpage, molded plastic substrate.

SUMMARY OF THE INVENTION

The above and other objects, which will become apparent from the specification as a whole, including the drawings, are accomplished in accordance with the present invention by placing at least one layer of a compliant material around a plurality of integrated circuit chips prior to encasing the chips with a polymeric substrate molding material.

Briefly, according to a preferred embodiment of the invention, a method for fabricating an integrated circuit module substrate uses the steps of: applying an insulative base sheet over a base member—the base sheet is topped with an adhesive layer. A plurality of integrated circuit chips, each having contact pads, are placed face down on the adhesive layer over the base sheet. At least one layer of a compliant material is disposed around the non-adhesive-containing surfaces of the chips. Then a mold form is positioned around a desired perimeter and surrounds the chips and compliant material. A polymeric substrate molding material is added to the mold form to encapsulate all surfaces of the chips and compliant material except those chip surfaces containing the contact pads which are in contact with the adhesive layer. The polymeric material is then hardened within the mold form. The mold form is removed, and then a high density interconnect (HDI) structure is disposed over the surfaces of the chip pads, with the base sheet optionally becoming a first dielectric layer for the HDI structure.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings, where like numerals represent like components, in which:

FIG. 1(b) is a cross-sectional view similar to that of FIG. 1(a), further showing a compliant material disposed between and around the chips;

FIG. 1(c) is a cross-sectional view similar to that of FIG. 1(b), further showing a mold form situated around the chips and compliant material and containing substrate molding material;

FIG. 1(d) is a cross-sectional view similar to that of FIG. 1(c), further showing embedded chips in a substrate molding material and having a compliant material disposed between and around the chips, after the mold form has been removed;

FIG. 1(e) is a cross-sectional view similar to that of FIG. 1(d), further showing a high density interconnect structure added to the chips on the molded substrate;

DETAILED DESCRIPTION

Figure 1A:
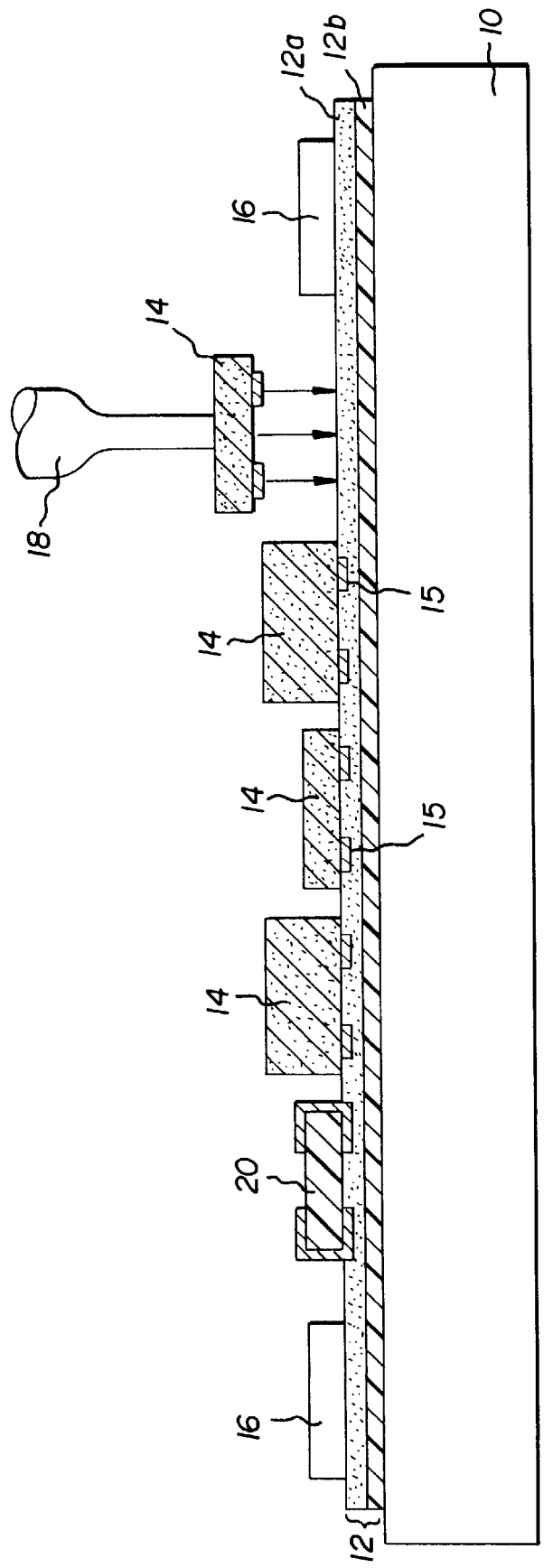
FIG. 1(a) is a cross-sectional view of chips placed face down on an adhesive coated film layer, which may comprise a portion of an interconnect layer in the completed module.

FIG. 1(a) is a cross-sectional view of a plurality of chips, represented by a capacitor 20 and integrated circuit chips 14, having chip pads 15, and being placed face down on a base sheet 12 which is supported by a base member 10. Base sheet 12 can be comprised of a film layer 12b of a polymer, such as "KAPTON" polyimide (Kapton is a trademark of E. I. DuPont de Nemours and Co.), coated with a contact adhesive layer 12a, such as "ULTEM" polyetherimide resin (Ultem is a registered trademark of General Electric Company, Pittsfield, Mass.) or an epoxy/polyimide copolymer blend such as that disclosed in commonly assigned Wojnarowski et al., U.S. Pat. No. 5,108,825, issued Apr. 28, 1992, which is herein incorporated by reference. Solvent die attach may be used, as described in commonly assigned Eichelberger et al., "High Density Interconnect Thermoplastic Die Attach Material and Solvent Die Attach Processing", U.S. application Ser. No. 07/745,982, filed Aug. 5, 1991, and issued Jul. 6, 1993 as U.S. Pat. No. 5,225,023, which is herein incorporated by reference. The phrase "face side down" means that contact pads 15 are in contact with adhesive layer 12a. Base member 10 may comprise any structural (preferably relatively rigid) material, such as, for example, plastic, ceramic, or metal.

Chips 14 may comprise any electrical circuit component, including active semiconductor chips, such as integrated circuits (ICs), and discrete devices, such as transistors, and passive components, such as for example, capacitors, resistors, inductors, and transducers. Chips 14, which do not necessarily have the same thickness, may be placed in contact with adhesive layer 12a in any conventional manner. In one embodiment, a pick-and-place machine 18 (partially shown) is used. In another embodiment, chips are placed precisely on a temporary surface such as wax or a film having low contact adhesion, such as wafer membrane of the types fabricated by Nitto Co. (known as "Nitto Tape") and Semiconductor Equipment Corp. (known as "Blue Membrane"), and then the chips, while still attached to the temporary surface, are placed down on base sheet 12. The use of a temporary surface is most effective when the chips have similar thicknesses.

Base sheet 12, comprised of adhesive layer 12a and polymer film 12b, may be used as the first dielectric layer for an HDI structure in which a dielectric layer typically comprises a thermoplastic or thermoset adhesive applied to a fully cured polymeric film. If desired, a plurality of adhesive/dielectric/metallization layers can be built-up and processed into a fully functional high density interconnect structure (described in detail below) with the chips 14 attached to the lower-most and exposed adhesive layer. Alternatively, base sheet 12 may be a sacrificial layer which is removed after molding. If the base sheet is used as a first dielectric layer, then preferably both the adhesive and polymer film layers are laser ablatable at wavelengths of 350–370 nm. In a preferred embodiment, an optional sheet frame 16 is temporarily used to keep base sheet flat on the surface of base member 10. Frame 16 is typically comprised of stainless steel, molybdenum, or titanium, but may comprise any appropriate structural material. After chip attachment, procedures such as reactive ion etching may be used to clean the backside of the silicon die and roughen adhesive 12a for better adhesion. Optionally, an adhesion promoter, (not shown) such as VM-651, (from E. I. du Pont de Nemours Company, Wilmington, Del.), may be applied to adhesive 12a by well known techniques prior to further module processing.

In accordance with the present invention, FIG. 1(b) shows a layer of compliant material 17, disposed on the back side of adhesive 12a and around chips 14. Compliant material 17 may be applied to the backside of chips 14 in a variety of ways which will be well known to those skilled in the art, such as by being sprayed, dipped, dispersed between chips by a micro syringe, spin applied, etc. Compliant material 17 is designed to act as a shock mount to break up and reduce any stress which may be generated by the difference in coefficient of thermal expansion between chips 14 and molding compound (discussed in detail hereinbelow).

Compliant material 17 may comprise a variety of materials, such as, for example, ultraviolet—(UV) and thermal-curable acrylates, UV- and therma- curable epoxies, polyimides and epoxy polyimide blends such as SPIE which is described in U.S. Pat. No. 5,108,825, entitled "Epoxy/Polyimide Copolymer Blend Dielectric and Layered Circuits Incorporating It", issued on Apr. 28, 1992, to Wojnarowski et al. Compliant material 17 may include therein filler material in a configuration of particles, fibers, screens, mats, or plates. The type and amount of filler material can be used to tailor various material properties, such as thermal conductivity and coefficient of thermal expansion, to meet module requirements. For example, compliant material 17 can include inorganic particles of glass, SiC, $Al_2O_3$, or AlN, particles of diamond or graphite, or metal particles of silver or copper. Glass, SiC, AlN, diamond, silica and graphite have low coefficients of thermal expansion, whereas the compliant material polymers and metals have higher coefficients of thermal expansion. The thermoconductive materials include SiC, AlN, copper, graphite, silica and diamond, with graphite and diamond being the better conductors.

A presently preferred compliant material 17 comprises a SPIE polymer material which consists of a blend of about 60 weight percent SPI solids and about 40 weight percent epoxy solids. This polymer is further blended with micro dispersed micronized silica particles, such as S-5631 micronized silica (from Sigma Chemical, St. Louis, Mo.), to produce a final composition of about 55 weight percent silica particles, about 27 weight percent SPI solids and about 18 weight percent epoxy solids in an appropriate solvent such as diglyme. The micronized silica preferably has a diameter of between about 2 to about 5 microns. The silica lowers the coefficient of thermal expansion of compliant material 17 closer to that of chips 14. In some instances it may be desirable to create moat regions surrounding the chips, while still leaving some compliant material 17 to reduce module stress. In such an instance, compliant material 17 should be laser ablatable or capable of being rendered laser ablatable in accordance with U.S. Pat. No. 5,169,678, entitled "Laser Ablatable Polymer Dielectrics and Methods", to Cole et al. Removal of solvent and full cure of the SPIE blend is achieved by a ramped bake step in a convection oven from approximately 100° C. to 200° C. and then held at this second temperature for approximately 30 minutes.

Figure 2:
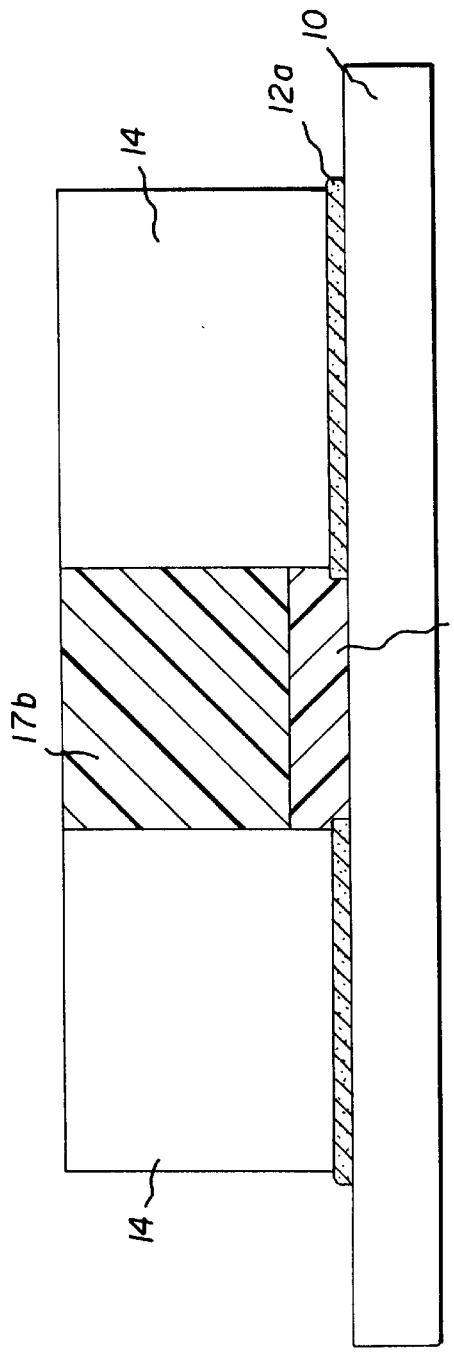
FIG. 2 is a cross-sectional view of two chips placed face down on an adhesive coated film layer with two layers of a compliant material.

As the solvent is removed and the polymer blend is cured, compliant material 17 shrinks and thereby only fills approximately 50 percent of the height between the chips 14. A 50 percent fill between chips 14 is adequate for many applications, however, when there is a particularly high density of chips 14, i.e., 25 chips with 15 mil. spacings, a thicker layer of compliant material 17 is required, as shown in FIG. 2. To produce a thick layer, two layers 17a and 17b are combined to create one thick layer of compliant material 17. This is typically accomplished by depositing a second application of SPIE (17b) or, alternatively, one thick layer of compliant material 17 can be made as a 100 percent solids mixture, e.g., using a liquid epoxy or UV-curable acrylic, in which case filling completely between chips 14 can be accomplished in a single application. When curing of this solventless layer takes place, no solvent loss occurs and, therefore, shrinkage is minimal. Yet another method of creating a thick layer 17 of compliant material is to deposit a second layer (17b) of another compliant material, such as a silicone, e.g., silicone RTV, acrylate, etc., over first layer 17a. After the second layer 17b of compliant material is cured, the resultant thickness is approximately 18–22 mils, which approximates the thickness of IC chips 14. It has been determined that, for the great majority of modules, chips 14 do not have to be totally immersed in compliant material 17. However, it should be understood that total chip immersion within compliant material 17 is within the scope of the present invention.

Figure 3:
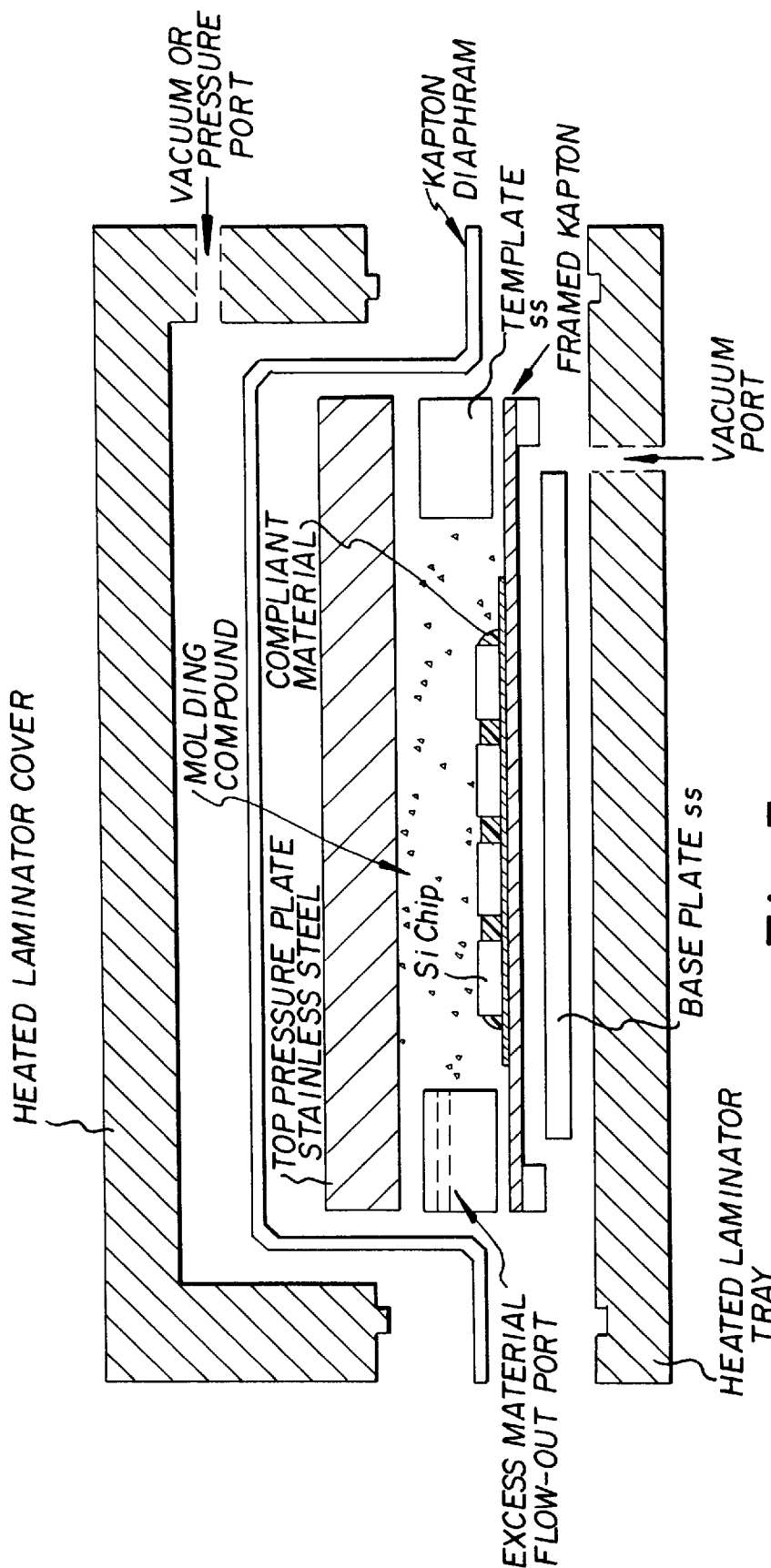
FIG. 3 is a cross-sectional view of a preferred laminator/mold form used to form and cure the substrate mold material.

FIG. 1(c) is a cross-sectional view of the apparatus of FIG. 1(b) further showing a mold form 22 situated around the chips and filled with a substrate molding material 24. Mold form 22 can comprise any appropriate structure capable of creating a "substrate" form, and may additionally be a structure capable of forming and curing the "substrate" under heat and pressure, such as that shown in FIG. 3. However, the mold form shown in FIG. 3 is only shown by way of a presently preferred example of how to form molding material 24 into a useable shape. Other, less complex designs may include simple walls which can hold a liquid-based molding material 24 until it is cured into a proper shape. Mold form 22 can be constructed from any structural material including, for example, plastic or metal, and can if the design permits, either remain with the molded substrate during further processing or be removed after preparing the mold. A removable mold form can be either sacrificial or reusable. If the mold form is reusable, it is useful to spray on a release agent (not shown), such as TEFLON polytetrafluoroethylene (TEFLON is a trademark of E. I. DuPont de Nemours and Co.), silicone or a non-stick vegetable oil before filling the mold form with the molding material.

Potential substrate molding materials 24 include, but are not limited to, aliphatic and aromatic polymers including thermoplastic and thermoset type polymers and blends of various polymers such as ULTEM polyetherimide resin, acrylates, polyurethanes, TEFLON polytetrafluoroethylene, epoxies, benzocyclobutene (BCB), polyimides, or other polymers. The molding material 24 will also likely include therein filler material in a configuration of particles, fibers, screens, mats or plates. As stated above (in discussing filler materials for compliant layer 17), the type and amount of filler material can be used to tailor various molding material properties, such a thermal conductivity and coefficient of thermal expansion, to meet module requirements.

A presently preferred molding material is a transfer molding powder, such as Hysol MG48F, (supplied by Dexter Corporation of Olean, N.Y.), or Plaskon SMT-B-1, (supplied by Amoco Electronic Material of Alpharetta, Ga.). This presently preferred molding material 24 is applied to the backsides of the compliantly coated die and placed into a mold form/laminator (FIG. 3). The chips and mold fixture are placed into the laminator which is preheated to approximately 200° C. and then vacuum is applied for approximately one minute. Once the mold fixturing temperature reaches 150° C., 50 pounds per square inch (psi) of pressure is applied to the top stainless steel plate, pressing the molding compound into the templates shape and forcing out excess material through exit holes that are machined into the template. The molding material 24 is cured under pressure for 30 minutes at 200° C. The mold form/laminator is then cooled to less than 100° C., and the pressure is reduced to atmospheric, and the plastic molded part is removed and trimmed (area 300 in FIGS. 1(b) and (c)). At this point, the cured plastic molded part is ready for further HDI processing.

FIG. 1(d) is a cross-sectional view of the apparatus of FIG. 1(c), further showing embedded chips after mold form 22 has been removed from molding material 24 and the base sheet 12 has been trimmed and separated from base member 10.

FIG. 1(e) is a cross-sectional view of the apparatus of FIG. 1(d), further showing a multi-layer HDI structure 26 situated on molded substrate 24 and including chips 20 and 14. HDI 26 structure includes a first interconnect layer 28 comprising a dielectric layer 12b with via openings 30a and supporting a pattern of electrical conductors 32a. A second interconnect layer 29 comprising a dielectric layer 35 with via openings 30b and supporting a pattern of electrical conductors 32b. Additional interconnect layers could be applied, if desired. Methods of forming and filling via openings 30a and 30b, methods of patterning electrical conductors 32a and 32b, and methods of fabricating one or more upper interconnect layers 29 are described in Gorczyca et al., U.S. Pat. No. 5,161,093, issued Nov. 03, 1992, Eichelberger et al., U.S. Pat. No. 4,835,704, issued May 30, 1989, and Eichelberger et al., U.S. Pat. No. 4,783,695, issued Nov. 8, 1988, each of which is commonly assigned and herein incorporated by reference.

As the multi-chip module shown in FIG. 1(e) is operated, chips 14 generate heat. Generally, the coefficient of thermal expansion of silicon is approximately 4 ppm/°C., whereas the coefficient of thermal expansion of a typical molding material 24 is approximately 14 ppm/°C. Thus as chips 14 begin to heat up, stresses within the module also increase due to the difference in expansion between chips 14 and molding materials 24. Compliant material 17 has a low modulus, and since it is placed in between the chips (where the maximum stress resides), it is able to stretch, yield to, and dissipate this stress before the stress reaches the high modulus molding material. For example, a typical compliant material, such as SPI 135, available from MicroSi Inc., of Phoenix, Ariz., has a modulus of approximately 100,000, whereas a typical molding material, such as Plaskon SMT-B-1, has a modulus of approximately 2,000,000.

There are other sources of stress within a multi-chip module where the low modulus of compliant material 17 can be useful. For example, some molding materials 24 have significant shrinkage in the Z-axis (from the top to the bottom of the module), which tends to warp the module. The prior method of overcoming this shrinkage is to mechanically machine the module, after molding material 24 has cured, to yield an acceptable module. However, with compliant material 17, these others sources of stress are also reduced significantly—thereby increasing significantly the ability to reproducably produce a planar module.

Figure 4:
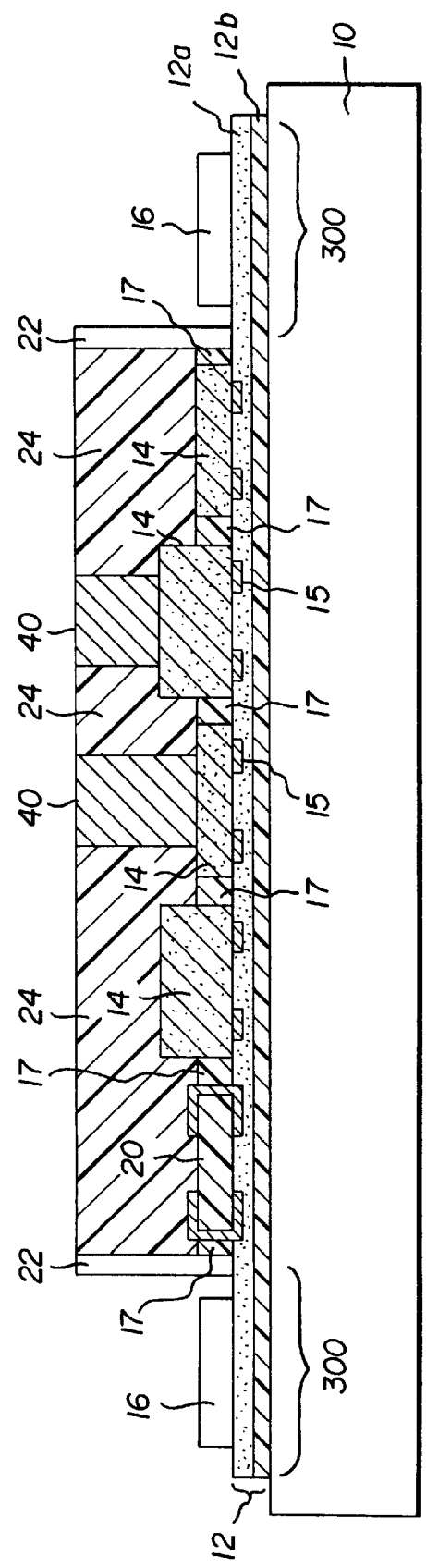
FIG. 4 is a cross-sectional view similar to that of FIG. 1(c), further showing thermal plugs situated on passive backsides of the chips for enhanced heat removal.

FIG. 4 is a cross-sectional view similar to that of FIG. 1(c), further including thermal or thermo-electrical plugs, shown as thermal plugs 40, situated on passive backsides of chips 14. These plugs can be bonded to the chips by silver epoxy (not shown) for grounding purposes, if desired. One of the significant advantages of the present invention is that thermal plugs 40 can be utilized to dissipate heat away from the backside of the chips, while utilizing the compliant material to ensure minimal stresses within the overall module. In all prior art methods, a reliable and stress-free module capable of incorporating thermal plugs was difficult to produce.

The thermal conductivity required of thermal plugs 40 varies according to thermal dissipation characteristics of the module, environmental conditions of the planned application, and the projected life of the circuit. Although high thermal conductivity filler material, such as graphite, silver epoxy, or diamond, is sufficient for most high power applications, for extremely high power densities, such as those exceeding 100 watts per module, thermal plugs 40 are useful. Thermal plugs 40 may comprise any thermally conductive material, including, for example, molybdenum or copper or a mixture, such as a silicon carbide matrix impregnated with aluminum, as fabricated by Lanxide Corporation. As shown in FIG. 4, the height of mold form 22 preferably does not exceed that of the thermal plugs 40 attached to chips 14. Thermal plugs 40, and mold form 22 are selected so that the resultant substrate and outer edges of the thermal plugs will be coplanar.

While the invention has been described in detail herein in accordance with certain preferred embodiments thereof, many modifications and changes therein may be effected by those skilled in the art. Accordingly, it is our intent to be limited only by the scope of the appending claims and not by way of the details and instrumentalities describing the embodiments shown herein.

What is claimed is:

1. An integrated circuit module, comprising:

a plurality of chips formed of a material having a first coefficient-of-temperature-expansion (CTE), each of said chips having contact pads located on a face thereof and all of said chips pads being substantially in a common plane;

at least one layer of a substantially-solid, compliant material having a second CTE different from said first CTE, and disposed around and between said chips and extending from said common face plane of said chips at least a substantial portion of the distance to the backsides of said chips;

hardened substrate molding material, having a third CTE different from the CTE of said compliant material, and surrounding said compliant material below said common face plane;

a dielectric layer situated on at least portions of said compliant material, the faces of said chips and said hardened substrate molding material, said dielectric layer including a plurality of vias therein, at least some of said plurality of vias being aligned with predetermined ones of said contact pads, respectively; and a pattern of electrical conductors extending through selected ones of said plurality of vias in said dielectric layer.

2. The module of claim 1, where said hardened substrate molding material comprises material selected from the group consisting of thermoplastics, thermosets, polyetherimide resins, polytetrafluoroethylenes, epoxies, benzocyclobutene, acrylates, polyurethanes, and polyimides.

3. The module of claim 2, where said substrate molding material includes therein filler material in a configuration selected from the group consisting of particles, fibers, screens, mats, plates, and combinations thereof.

4. The module of claim 3, where said filler material is selected from the group consisting of glass, SiC, AlN, diamond, graphite, $Al_2O_3$, metal, and combinations thereof.

5. The module of claim 1, where a first layer of said at least one layer of compliant material comprises material selected from the group consisting of ultraviolet-curable and thermal-curable acrylates, and ultraviolet-curable and thermal-curable epoxies, polyimides and epoxy/polyimide blends.

6. The module of claim 5, where said at least one layer of compliant material includes therein filler material in a configuration selected from the group consisting of particles, fibers, screens, mats, plates, and combinations thereof, and where said filler material is selected from the group consisting of glass, SiC, AlN, diamond, graphite, $Al_2O_3$, metal, and combinations thereof.

7. The module of claim 5, where an additional layer of said at least one layer of compliant material comprises material selected from the group consisting of silicones, ultraviolet-curable and thermal-curable acrylates, ultraviolet-curable and thermal-curable epoxy/polyimide blends.

8. The module of claim 1, where said substrate molding material comprises a transfer molding material.

9. The module of claim 1, further including a thermal plug extending from the backside of at least one of said chips prior at least through to the opposite side of said hardened substrate molding material.

10. The module of claim 9, where said thermal plug comprises an electrically conductive material.

11. The module of claim 10, where said thermal plug comprises a material selected from the group consisting of copper, molybdenum, and a silicon carbide matrix impregnated with aluminum.

* * * * *